United States Patent
Kim

(10) Patent No.: US 12,014,782 B2
(45) Date of Patent: Jun. 18, 2024

(54) MEMORY DEVICE FOR ADJUSTING MAGNITUDE OF SIGNAL USED TO PRECHARGE BIT LINE ACCORDING TO POSITION OF PLUG HOLE AND OPERATING METHOD THEREOF

(71) Applicant: SK hynix Inc., Icheon-si (KR)

(72) Inventor: Jung Hyeong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 155 days.

(21) Appl. No.: 17/561,228

(22) Filed: Dec. 23, 2021

(65) Prior Publication Data

US 2022/0392544 A1    Dec. 8, 2022

(30) Foreign Application Priority Data

Jun. 2, 2021 (KR) .......................... 10-2021-0071813

(51) Int. Cl.
| | |
|---|---|
| *G11C 16/26* | (2006.01) |
| *G11C 16/08* | (2006.01) |
| *G11C 16/24* | (2006.01) |
| *G11C 16/30* | (2006.01) |
| *G11C 16/04* | (2006.01) |
| *H10B 43/27* | (2023.01) |

(52) U.S. Cl.
CPC .............. *G11C 16/26* (2013.01); *G11C 16/08* (2013.01); *G11C 16/24* (2013.01); *G11C 16/30* (2013.01); *G11C 16/0483* (2013.01); *H10B 43/27* (2023.02)

(58) Field of Classification Search
CPC ..... G11C 16/08; G11C 16/0483; G11C 16/30; G11C 16/24; G11C 16/26; H10B 43/27

USPC ...................................................... 365/189.05
See application file for complete search history.

(56) References Cited

U.S. PATENT DOCUMENTS

| | | | | |
|---|---|---|---|---|
| 2008/0173932 A1* | 7/2008 | Kidoh | ...................... | H10B 43/27 |
| | | | | 257/E21.679 |
| 2015/0221389 A1* | 8/2015 | Kim | ................... | G11C 16/3445 |
| | | | | 365/185.17 |
| 2016/0232975 A1* | 8/2016 | Oh | ........................... | G11C 7/04 |
| 2017/0069731 A1* | 3/2017 | Kim | ....................... | H10B 41/41 |
| 2017/0309636 A1* | 10/2017 | Lee | ................... | H01L 29/66666 |

(Continued)

FOREIGN PATENT DOCUMENTS

| | | |
|---|---|---|
| KR | 1020150059499 A | 6/2015 |
| KR | 1020200033584 A | 3/2020 |

*Primary Examiner* — Sung Il Cho
(74) *Attorney, Agent, or Firm* — WILLIAM PARK & ASSOCIATES LTD.

(57) ABSTRACT

A memory device includes a memory block to which a plurality of lines are connected. The memory device also includes a plurality of memory cells respectively connected to word lines among the plurality of lines, wherein the plurality of memory cells are formed as a plurality of plug holes formed in a stack structure between a drain select line among the plurality of lines and a slit. The memory device further includes a plurality of page buffers connected to the plurality of memory cells through a plurality of bit lines among the plurality of lines. The memory device additionally includes a peripheral circuit for performing a read operation on the plurality of memory cells. The peripheral circuit includes a voltage generator configured to control a signal applied to the plurality of page buffers so that the read operation is performed according to positions of the plug holes.

20 Claims, 17 Drawing Sheets

(56) References Cited

U.S. PATENT DOCUMENTS

| | | | |
|---|---|---|---|
| 2018/0025784 A1* | 1/2018 | Lee ...................... | G06F 3/0679 |
| | | | 711/103 |
| 2020/0135283 A1* | 4/2020 | Park ...................... | G06F 3/0604 |
| 2020/0227432 A1* | 7/2020 | Lai ........................ | H10B 43/10 |
| 2021/0312989 A1* | 10/2021 | Yun ...................... | G11C 29/021 |
| 2022/0051714 A1* | 2/2022 | Bang .................. | G11C 16/3418 |

* cited by examiner

MEMORY DEVICE FOR ADJUSTING MAGNITUDE OF SIGNAL USED TO PRECHARGE BIT LINE ACCORDING TO POSITION OF PLUG HOLE AND OPERATING METHOD THEREOF

CROSS-REFERENCE TO RELATED APPLICATION

The present application claims priority under 35 U.S.C. § 119(a) to Korean patent application number 10-2021-0071813, filed on Jun. 2, 2021, in the Korean intellectual Property Office, the entire disclosure of which is incorporated herein by reference.

BACKGROUND

1. Technical Field

The present disclosure generally relates to an electronic device, and more particularly, to a memory device and an operating method thereof.

2. Related Art

A storage device is a device configured to store data under the control of a host device such as a computer; a smart phone, or a smart pad. The storage device includes a device configured to store data on a magnetic disk, such as a Hard Disk Drive (HDD), and a device configured to store data in semiconductor memory, particularly, nonvolatile memory, such as memory included in a Solid State Drive (SSD) or a memory card.

The storage device may include a memory device configured to store data and a memory controller configured to control the memory device. The memory device is classified as a volatile memory device or a nonvolatile memory device. A nonvolatile memory device may include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), Ferroelectric RAM (FRAM), and the like.

SUMMARY

Embodiments provide a memory device for controlling a signal applied to a page buffer distinguished for each plug hole, and an operating method of the memory device.

In accordance with an embodiment of the present disclosure, a memory device includes a memory block to which a plurality of lines are connected. The memory device also includes a plurality of memory cells respectively connected to word lines among the plurality of lines, wherein the plurality of memory cells are formed as a plurality of plug holes formed in a stack structure between a drain select line among the plurality of lines and a slit. The memory device further includes a plurality of page buffers connected to the plurality of memory cells through a plurality of bit lines among the plurality of lines. The memory device additionally includes a peripheral circuit for performing a read operation on the plurality of memory cells. The peripheral circuit includes a voltage generator configured to control a signal applied to the plurality of page buffers so that the read operation is performed according to positions of the plug holes.

In accordance with another aspect of the present disclosure is a method for operating a memory device including a memory block to which a plurality of lines are connected. The method includes distinguishing a plurality of plug holes formed in a stack structure according to positions of the plug holes, when a plurality of memory cells respectively connected to word lines among the plurality of lines are formed as the plug holes between a drain select line among the plurality of lines and a slit, in a read operation on the memory block. The method also includes controlling a signal applied to a plurality of page buffers connected to the plurality of memory cells through a plurality of bit lines among the plurality of lines according to the positions of the plug holes.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as being limited to the embodiments set forth herein.

Figure 1:
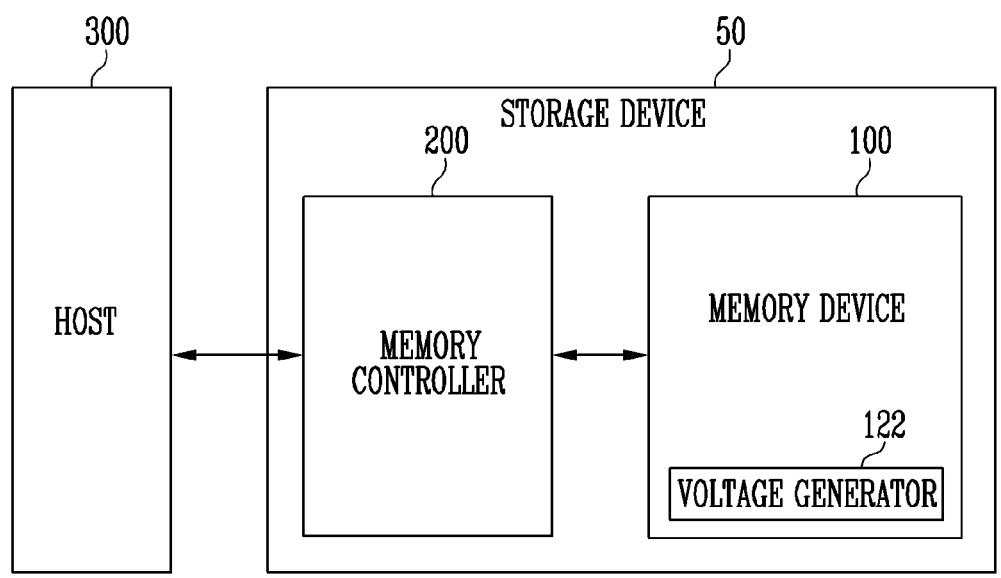
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may be a device for storing data under the control of a host 300, such as a mobile phone, a smart phone, an MP3 player, a laptop computer, a desktop computer, a game console, a TV, a tablet PC, or an in-vehicle infotainment.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells, and the plurality of memory cells may constitute a plurality of pages. In an embodiment, the page may be a unit for storing data in the memory device 100 or reading data stored in the memory device 100. The memory block may be a unit for erasing data.

In an embodiment, the memory device 100 may include Double Data Rate Synchronous Dynamic Random Access Memory (DDR SDRAM), Low Power Double Data Rate 4 (LPDDR4) SDRAM, Graphics Double Data Rate (GDDR) SDRAM, Low Power DDR (LPDDR) SDRAM, Rambus Dynamic Random Access Memory (RDRAM), NAND flash memory, vertical NAND flash memory, NOR flash memory, Resistive Random Access Memory (RRAM), Phase-Change Random Access Memory (PRAM), Magnetoresistive Random Access Memory (MRAM), Ferroelectric Random Access Memory (FRAM), Spin Transfer Torque Random Access Memory (STT-RAM), or the like. In this specification, for convenience of description, a case where the memory device 100 includes NAND flash memory is assumed and described.

In an embodiment, the memory device 100 may be implemented in a two-dimensional array structure or three-dimensional array structure. Hereinafter, although a case where the memory device 100 is implemented in the three-dimensional array structure is described as an embodiment, the present disclosure is not limited to the three-dimensional array structure. The present disclosure may be applied to not only a flash memory device, in which a charge storage layer is configured with a Floating Gate (FG), but also a Charge Trap Flash (CTF), in which a charge storage layer is configured with an insulating layer.

In an embodiment, the memory device 100 may be operated using a Single-Level Cell (SLC) method in which one data bit is stored in one memory cell. Alternatively, the memory device 100 may be operated using a method in which at least two data bits are stored in one memory cell. For example, the memory device 100 may be operated using a Multi-Level Cell (MLC) method in which two data bits are stored in one memory cell, a Triple-Level Cell (TLC) method in which three data bits are stored in one memory cell, or a Quadruple-Level Cell (QLC) method in which four data bits are stored in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, or an erase operation according to the received command. For example, when a program command is received, the memory device 100 may program data in the area selected by the address. When a read command is received, the memory device 100 may read data from the area selected by the address. When an erase command is received, the memory device 100 may erase data stored in the area selected by the address.

In an embodiment, a difference in threshold voltage distribution of memory cells between plug holes may occur when the memory device 100 performs a program operation. The plug hole may be formed in a vertical hole vertically penetrating word lines and interlayer insulating layers when memory cells are formed in a stack structure in a three-dimensional array structure.

In an embodiment, the width of memory cells included in the plug hole may be changed according to a position of the plug hole, i.e., an upper portion or a lower portion of the plug hole. In addition, the width of memory cells included in each plug hole between adjacent plug holes may be changed. Therefore, when the width of memory cells is changed, a difference in threshold voltage distribution of a memory cells between plug holes may occur in the program operation.

In an embodiment, the memory device 100 may distinguish page buffers from each other, based on addresses of memory cells. For example, some of the strings to which memory cells are connected may be connected to page buffers through even bit lines, and the other strings may be connected to the page buffers through odd bit lines. When the memory device 100 performs an operation, the memory device 100 may perform an operation on memory cells connected to the even bit lines or perform an operation on memory cells connected to the odd bit lines.

However, when the page buffers are distinguished based on the addresses, a difference in threshold voltage distribution of memory cells between plug holes may occur as described above.

Therefore, in the present disclosure, in order to compensate for the difference in threshold voltage distribution of memory cells between plug holes, there is disclosed a method for distinguishing page buffers for each plug hole and controlling the level of a signal applied to a page buffer for each plug hole in a sensing operation. The sensing operation may be a read operation or a verify operation.

In an embodiment, the memory device 100 includes a voltage generator 122. The voltage generator 122 may control a signal to be applied to page buffers for each plug hole in the sensing operation. That is, an operation may be performed for each plug hole, instead of the operation on the memory cells connected to the even bit lines or the memory cells connected to the odd bit lines. The voltage generator 122 may control the magnitude of a signal applied to a page buffer for each plug hole. For an embodiment, the magnitude of a signal implies the voltage magnitude of the signal.

The memory controller 200 may control overall operations of the storage device 50.

When a power voltage is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may include firmware (not shown) which receives data and a logical block address LBA from the host 300, and translates the logical block address LBA into a physical block address PBA representing addresses of memory cells included in the memory device 100, in which data is to be stored. Also, the memory controller 200 may store, in a buffer memory (not shown), a logical-physical address mapping table that establishes a mapping relationship between the logical block address LBA and the physical block address PBA.

The memory controller 200 may control the memory device 100 to perform a program operation, a read operation, an erase operation, or the like in response to a request from the host 300. For example, when a program request is received from the host 300, the memory controller 200 may change the program request into a program command, and provide the memory device 100 with the program command, a physical block address PBA, and data. When a read request is received together with a logical block address LBA from the host 300, the memory controller 200 may change the read request into a read command, select a physical block address PBA corresponding to the logical block address LBA, and then provide the memory device 100 with the read command and the physical block address PBA. When an erase request is received together with a logical block address LBA from the host 300, the memory controller 200 may change the erase request into an erase command, select a physical block address PBA corresponding to the logical block address LBA, and then provide the memory device 100 with the erase command and the physical block address PBA.

In an embodiment, the memory controller 200 may control at least two memory devices. The memory controller 200 may control the memory devices according to an interleaving scheme so as to improve operational performance.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
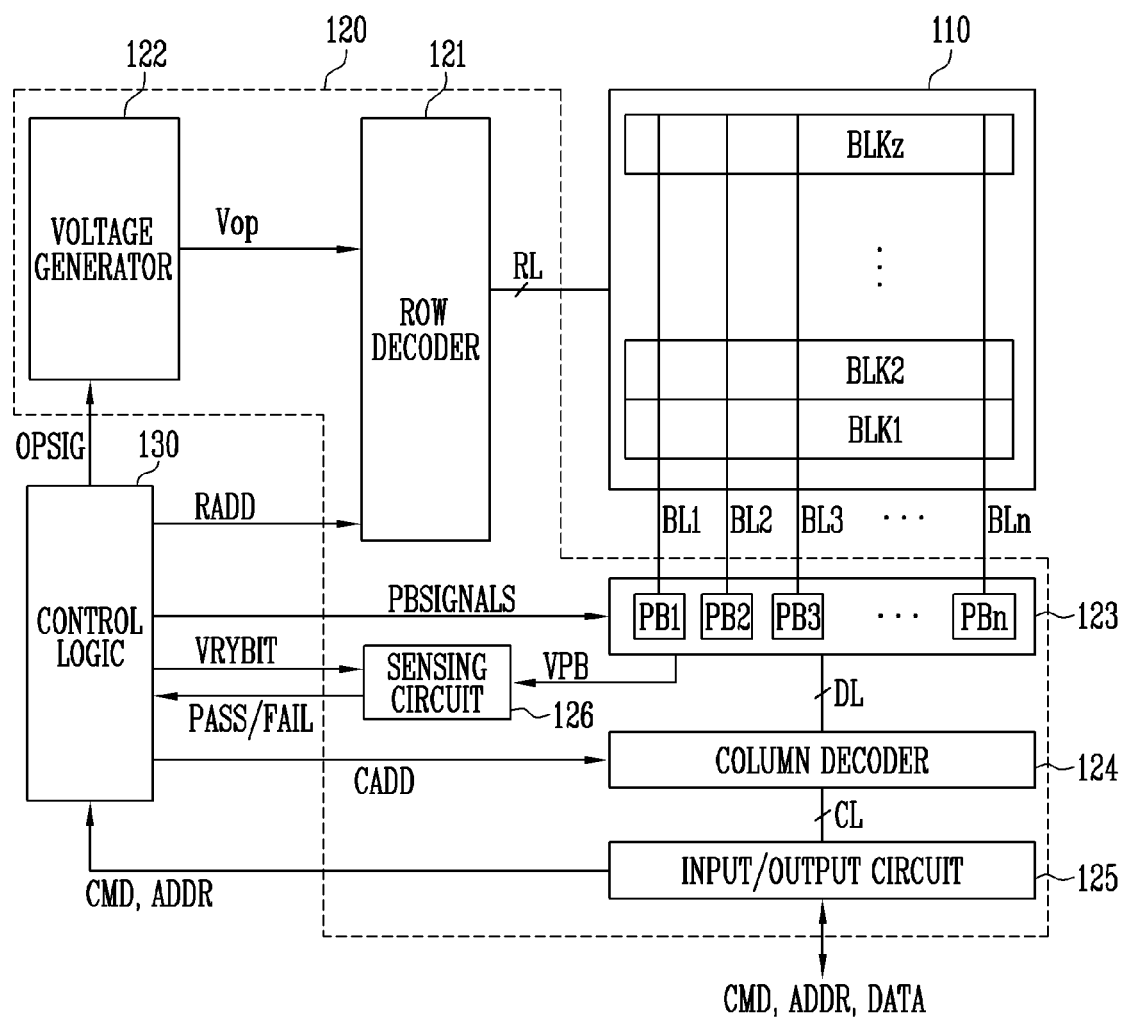
FIG. 2 is a block diagram illustrating a structure of a memory device shown in FIG. 1.

FIG. 2 is a diagram illustrating a structure of the memory device shown in FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single-Level Cell (SLC) storing one data bit, a Multi-Level Cell (MLC) storing two data bits, a Triple-Level Cell (TLC) storing three data bits, or a Quadruple-Level Cell (QLC) storing four data bits.

The peripheral circuit 120 may perform a program operation, a read operation, or an erase operation on a selected region of the memory cell array 110 under the control of the control logic 130. The peripheral circuit 120 may drive the memory cell array 110. For example, the peripheral circuit 120 may apply various operating voltages to the row is lines RL and the bit lines BL1 to BLn or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 decodes a row address RADD received from the control logic 130. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage higher than the verify voltage to the unselected word lines. In a read operation, the row decoder 121 may apply a read voltage to the selected word line, and apply a read pass voltage higher than the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines connected to the selected memory block.

The voltage generator 122 operates under the control of the control logic 130. The voltage generator 122 generates a plurality of voltages by using an external power voltage supplied to the memory device 100. Specifically, the voltage generator 122 may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to nth page buffers PB1 to PBn. The first to nth page buffers PB1 to PBn are connected to the memory cell array 110 respectively through first to nth bit lines BL1 to BLn. The first to nth page buffers PB1 to PBn operate under the control of the control logic 130. Specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or sense a voltage or current of the first to nth bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page are programmed according to the transferred data DATA. In a program verify operation, the first to nth page buffers PB1 to PBn read page data by sensing a voltage or current received from the selected memory cells through the first to nth bit lines BL1 to BLn.

In a read operation, the first to nth page buffers PB1 to PBn read data DATA from the memory cells of the selected page through the first to nth bit lines BL1 to BLn, and outputs the read data DATA to the input/output circuit 125 under the control of the column decoder 124.

In an erase operation, the first to nth page buffers PB1 to PBn may float the first to nth bit lines BL1 to BLn or apply an erase voltage.

The column decoder 124 may communicate data between the input/output circuit 125 and the page buffer group 123 in response to a column address CADD. For example the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller (200 shown in FIG. 1), to the control logic 130, or exchange data DATA with the column decoder 124.

In a read operation or verify operation, the sensing circuit 126 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. For example, the control logic 130 may control a read operation of a selected memory block in response to a sub-block read command and an address. Also, the control logic 130 may control an erase operation a selected sub-block included in the selected memory block in response to a sub-block erase command and an address. Also, the control logic 130 may determine whether the verify operation has passed or failed in response to the pass or fail signal PASS or FAIL. The control logic 130 may be implemented as hardware, software, or a combination of hardware and software. For example, the control logic 130 may be a control logic circuit operating in accordance with an algorithm and/or a processor executing control logic code.

Figure 3:
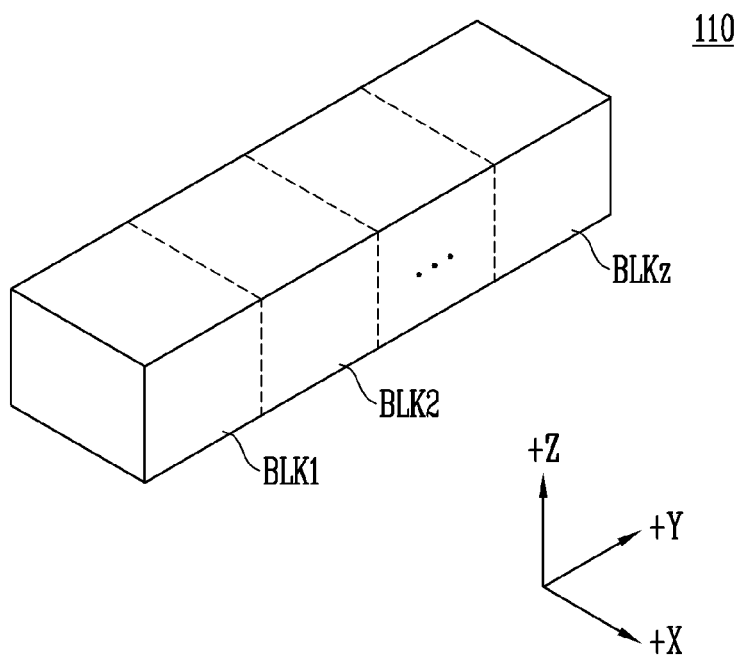
FIG. 3 is a diagram illustrating an embodiment of a memory cell array shown in FIG. 2.

FIG. 3 is a diagram illustrating an embodiment of the memory cell array 110 shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
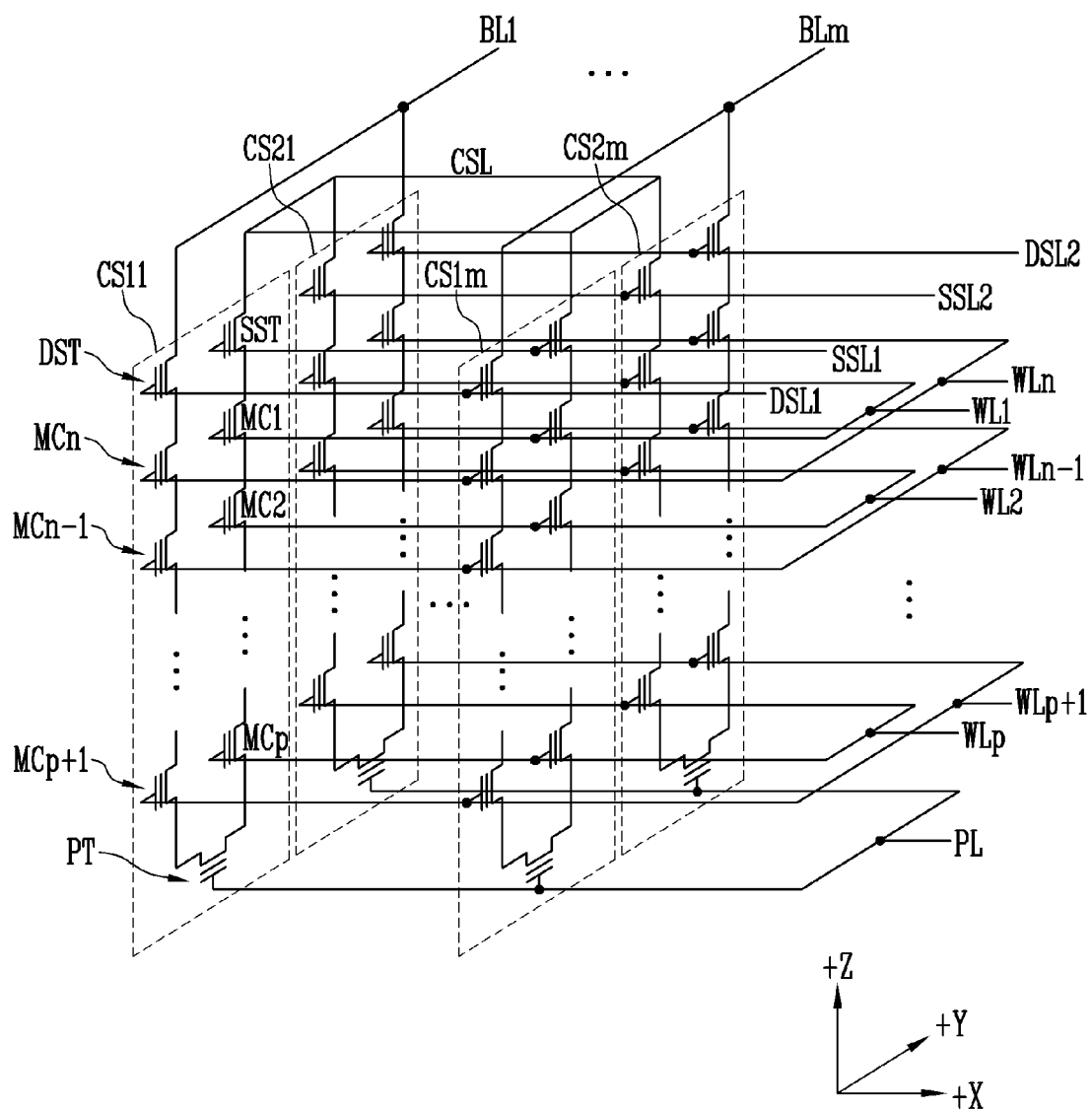
FIG. 4 is a circuit diagram illustrating an embodiment of a memory block among memory blocks shown in FIG. 3.

FIG. 4 is a circuit diagram illustrating any one memory block BLKa among the memory blocks BLK1 to BLKz shown in FIG. 3.

Referring to FIG. 4, the memory block BLKa may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (i.e., a +X direction). Although a case where two cell strings arranged in a column direction (i.e., a +Y direction) is illustrated in FIG. 4, this is for convenience of description, and it will be understood that three or more cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. In FIG. 4, the source select transistors of the cell strings CS11 to CS1m on a first row are connected to a first source select line SSL1. The source select transistors of the cell strings CS21 to CS2m on a second row are connected to a second source select line SSL2.

In another embodiment, the source select transistors of the cell strings CS11 to CS1m and CS21 to CS2m may be commonly connected to one source select line.

The first to nth memory cells MC1 to MCn of each cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the row direction are connected to a drain select line extending in the row direction. The drain select transistors of the cell strings CS11 to CS1m on the first row are connected to a first drain select line DSL1. The drain select transistors of the cell strings CS21 to CS2m on the second row are connected to a second drain select line DSL2.

Cell strings arranged in the column direction are connected to a bit line extending in the column direction. In FIG. 4, the cell strings CS11 and CS21 on a first column are connected to a first bit line BL1. The cell strings CS1m and CS2m on an mth column are connected to an mth bit line BLm.

Memory cells connected to the same word line in the cell strings arranged in the row direction constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can receive the required threshold voltage.

Figure 5:
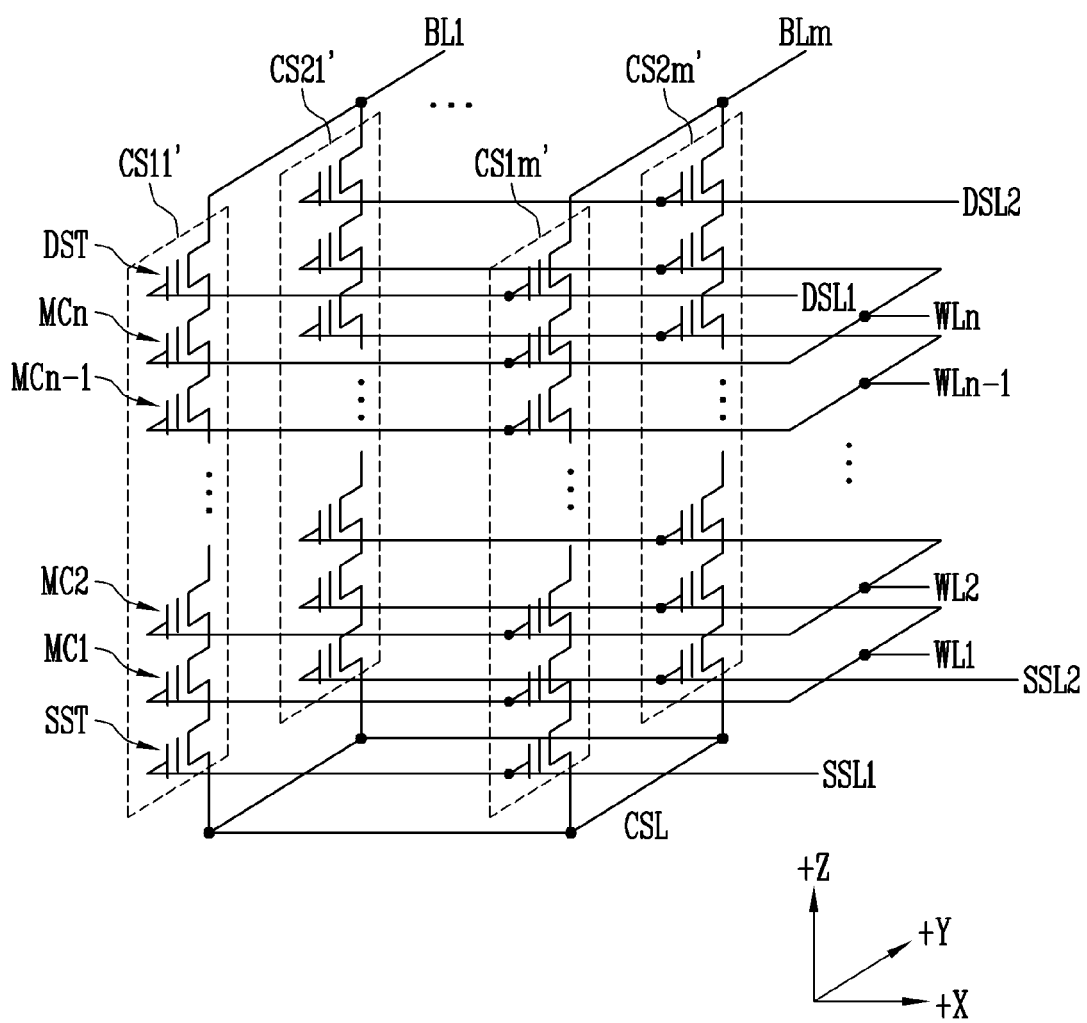
FIG. 5 is a circuit diagram illustrating another embodiment of a memory block among the memory blocks shown in FIG. 3.

FIG. 5 is a circuit diagram illustrating another embodiment BLKb of any one memory block among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line Sal. Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In addition, at least one of the first to nth memory cells MC1 to MCn may be used as a dummy memory cell so as to decrease an electric field between the source select transistor SST and the memory cells MC1 to MCn.

Figure 6:
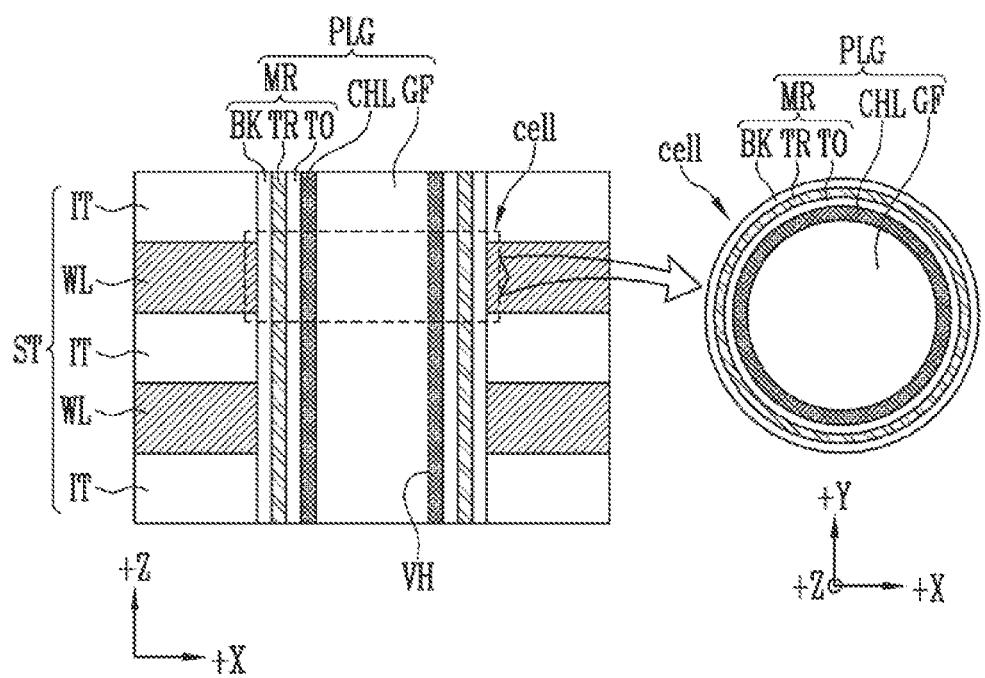
FIG. 6 is a diagram illustrating a memory cell included in a memory block having a three-dimensional structure.

FIG. 6 is a diagram illustrating a memory cell included in a memory block having a three-dimensional structure.

Referring to FIG. 6, the memory block may be formed as a stack structure ST including a plurality of word lines WL and interlayer insulating layers IT, which are stacked in a direction (+Z) perpendicular to a substrate, and a plug PLG vertically penetrating the word lines WL and the interlayer insulating layers IT. The word lines WL and the interlayer insulating layers IT may be alternately stacked. The word lines WL may be formed of a conductive material, and the interlayer insulating layers IT may be formed of an insulating material.

The plug PLG may include a gap fill layer GF, a channel layer CHL, and a memory layer MR, which are formed in a vertical hole VH vertically penetrating the word lines WL and the interlayer insulating layers IT. The gap fill layer GF may be formed in a circular pillar shape extending the vertical direction (+Z) at the center of the vertical hole VH. The channel layer CHL may be formed in a cylindrical shape surrounding a sidewall of the gap fill layer GF, and the memory layer MR may be formed in a cylindrical shape surrounding a sidewall of a channel layer CHL. The gap fill layer GF may be formed of an insulating material, and the channel layer CHL may be formed of poly-silicon. Alternatively, instead of the gap fill layer GF, the channel layer CHL may be formed in a circular pillar shape at the center of the vertical hole VH.

The memory layer MR may include a tunnel insulating layer TO having a cylindrical shape, which surrounds the sidewall of the channel layer CHL, a charge trap layer TR having a cylindrical shape, which surrounds a sidewall of the tunnel insulating layer TO, and a blocking layer BK having a cylindrical shape, which surrounds a sidewall of the charge trap layer TR. The tunnel insulating layer TO may be formed as an oxide layer which is made of an insulating material, the charge trap layer TR may be formed as a nitride layer, and the blocking layer BK may be formed as an oxide layer which is made of an insulating material. The tunnel insulating layer TO is a layer in which electrons tunnel between the channel layer CHL and the charge trap layer TR, the charge trap layer TR is a layer in which electrons are trapped, and the blocking layer BK is a layer which blocks electrons trapped in the charge trap layer TR from moving to the word line WL.

A memory cell includes a plug adjacent to a word line in the stack structure ST, and the width of the memory cell is defined by each component constituting the plug PLG.

For example, the plug PLG is formed in the vertical hole VH vertically penetrating the word lines WL and the interlayer insulating layers IT, and therefore, the width of the plug PLG is determined according to the width of the vertical hole VH.

Ideally, the width of the vertical hole VH is to be the same regardless of the position of the vertical hole VH. However, the width of the vertical hole VH may be formed differently according to the height of the stack structure ST due to characteristics of a manufacturing process. Therefore, because the memory cells may also be formed differently depending on heights of the memory cells, operating voltages may be set differently depending on structures of the memory cells in this embodiment. The structures of the memory cells may correspond to the width of the memory cells.

In addition, although the structures of the memory cells are similar to one another, an electrical difference may exist due to characteristics of a material constituting the memory cell or the word line WL. Therefore, the word lines WL may be grouped according to the structures of the memory cells, groups of the word lines WL may be flexibly changed according to electrical characteristics of the memory cells, and operating voltages may be set differently according to the changed groups.

Figure 7:
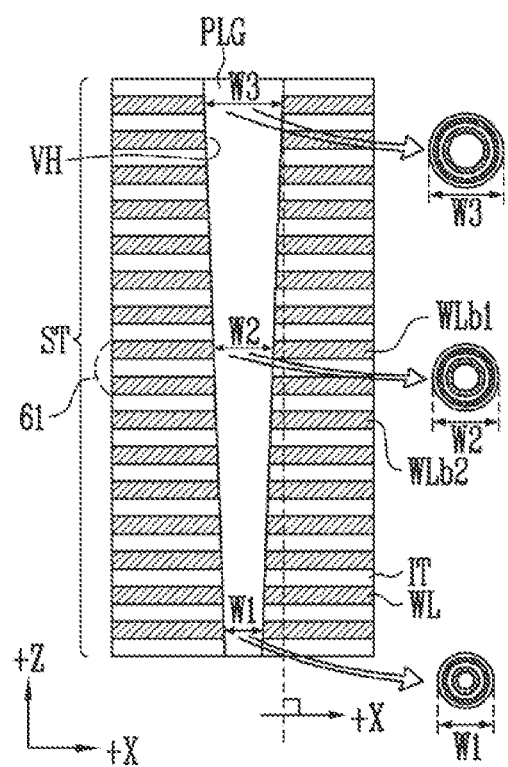
FIG. 7 is a diagram illustrating a memory block having a single stack structure.

FIG. 7 is a diagram illustrating a memory block having a single stack structure.

Referring to FIG. 7, the single stack structure ST is a structure in which a vertical hole VH vertically penetrating word lines WL and interlayer insulating layers IT, which are stacked, is formed through a one-time etching process. Due to the etching process, the vertical hole VH may be formed to have an upper width wider than a lower width thereof. That is, the slope of a sidewall of the vertical hole VH might not be perpendicular to a substrate, and may have a curved surface. For example, when the width of a lowermost portion of the vertical hole VH is a first width W1, the width of an intermediate height of the vertical hole VH may be a second width W2 wider or narrower than the first width W1, and the width of an uppermost portion of the vertical hole VH may be a third width W3 wider than the second width W2.

Therefore, widths of memory cells included in a plug PLG may be different according to positions of the plug PLG. For example, a memory cell formed at a lowermost portion of the plug PLG may have the first width W1, a memory cell formed at an intermediate height of the plug PLG may have the second width W2, and a memory cells formed at an uppermost portion of the plug PLG may have the third width W3.

Therefore, the word lines WL included in the single stack structure ST may be divided into a plurality of groups according to structures of the memory cells. For example, the word lines WL may be divided into a first group GR1 in which memory cells have narrow widths and a second group GR2 in which memory cells have wide widths. For example, word lines WL formed in a lower region including a first boundary word line WLb1 formed at the center of a memory string may be included in the first group GR1, and word lines WL formed in an upper region above the first boundary word line WLb1 may be included in the second group GR2.

In an embodiment, in a program or read operation, a voltage applied to a selected word line and a voltage applied to unselected word lines may be set differently according to the first and second groups GR1 and GR2.

A boundary or reference with respect to how the first and second groups GR1 and GR2 are distinguished from each other may be set as a word line located at an uppermost end in the first group CR1, set as a word line located at a lowermost end in the second group GR2, or set as a region in which the interlayer insulating layers IT are formed between adjacent word lines in the first and second groups GR1 and GR2.

A boundary region with respect to how the first and second groups CR1 and GR2 are distinguished from each other may be flexibly changed through a test operation of some memory cells included between the first and second groups GR1 and GR2.

Figure 8:
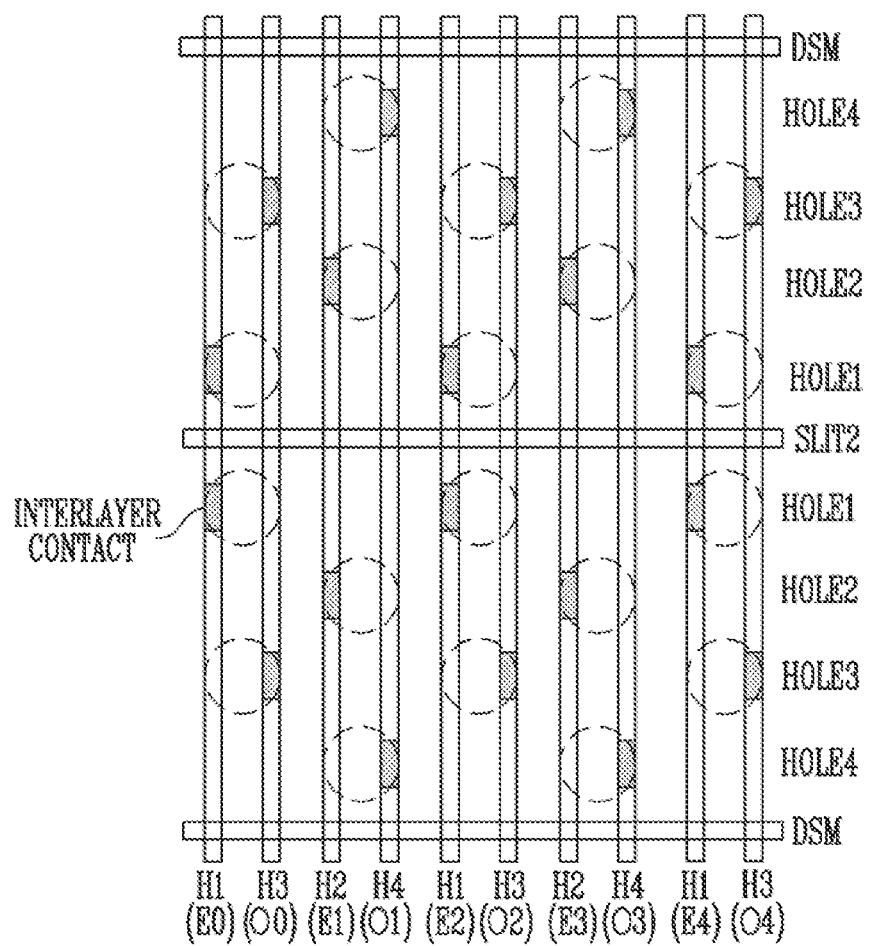
FIG. 8 is a diagram illustrating a multi-stack structure.

FIG. 8 is a diagram illustrating a multi-stack structure.

Referring to FIGS. 7 and 8, FIG. 8 illustrates a plan view when the single stack shown in FIG. 7 is stacked in plurality. In FIG. 8, a dotted portion represents any one of a plurality of plug holes.

In an embodiment, a plurality of stacks may be stacked between a DSL select mask DSM and a slit SLIT2. The DSL select mask DSM and the slit SLIT2 may be connected through first to fourth lines H1 to H4. The DSL select mask DSM is a mask marked to distinguish a drain select line, and the slit SLIT2 may be a region which distinguishes stacked stacks and is secured to connect a peripheral circuit to the bottom of a stack structure through a metal.

In addition, the first line H1 may be connected to a zeroth even bit line E0, a second even bit line E2, and a fourth even bit line E4; the second line H2 may be connected to a first even bit line E1 and a third even bit line E3; the third line H3 may be connected to a zeroth odd bit line O0, a second odd bit line O2, and a fourth odd bit line O4; and the fourth line H4 may be connected to a first odd bit line O1 and a third odd bit line O3.

In an embodiment, each of the first to fourth lines H1 to H4 may be connected to one plug hole between the DSL select mask DSM and the slit SLT2.

For example, the first line H1 connected to the zeroth even bit line E0 may be connected to a first plug hole HOLE1 through an interlayer contact INTERLAYER CONTACT. In addition, the third line H3 connected to the zeroth odd bit line O0 may be connected to a third plug hole HOLE3 through an interlayer contact INTERLAYER CONTACT, the second line H2 connected to the first even bit line E1 may be connected to a second plug hole HOLE2 through an interlayer contact INTERLAYER CONTACT, and the fourth line H4 connected to the first odd bit line O1 may be connected to a fourth plug hole HOLE4 through an interlayer contact INTERLAYER CONTACT.

In the above-described manner, a line connected to each bit line may be connected to a plug hole through an interlayer contact INTERLAYER CONTACT.

Figure 9:
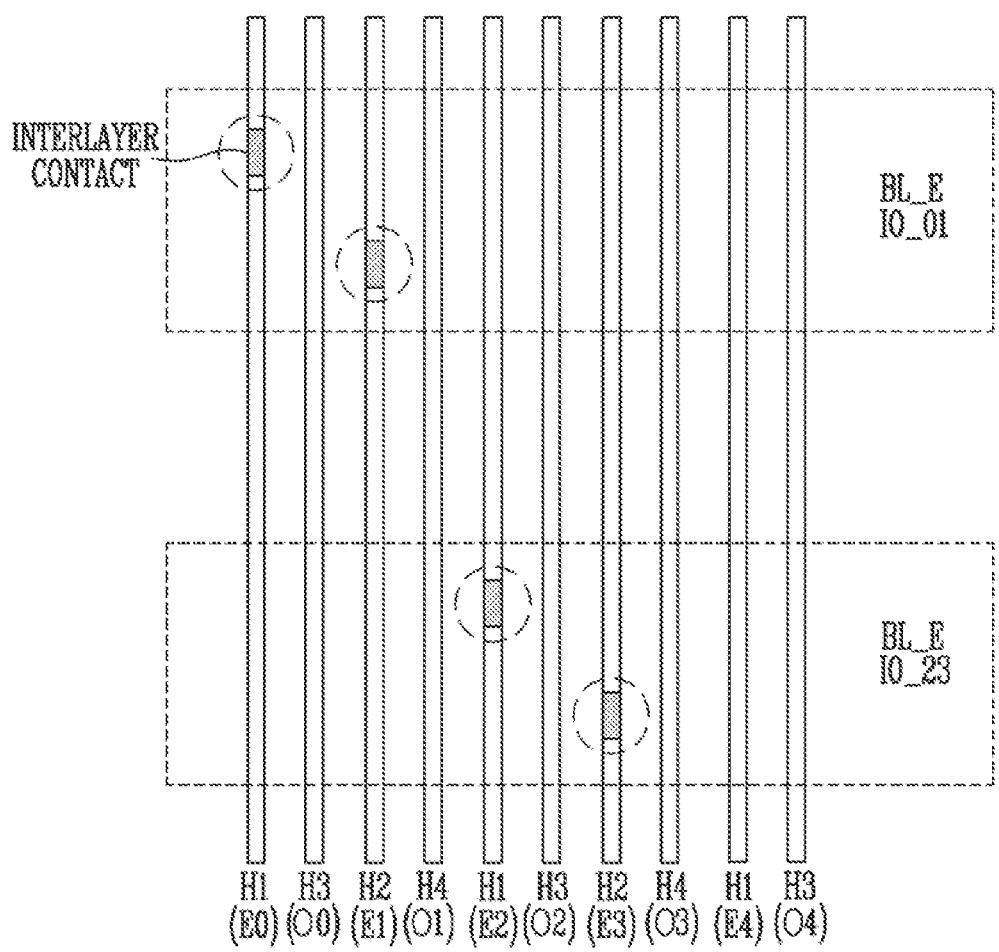
FIG. 9 is a diagram illustrating a method for performing an operation for each bit line.

FIG. 9 is a diagram illustrating a method for performing an operation for each bit line.

Referring to FIGS. 8 and 9, FIG. 9 illustrates a method for performing an operation on memory cells connected to even bit lines BL_E in the multi-stack structure shown in FIG. 8.

In an embodiment, one even bit line and one odd bit line, which are adjacent to each other, may be connected to one page buffer. For example, the zeroth even bit line E0 connected to the first bit line H1 and the zeroth odd bit line O0 connected to the third line H3 may be connected to one page buffer, and the first even bit line E1 connected to the second line H2 and the first odd bit line O1 connected to the fourth line H4 may be connected to one page buffer.

In an embodiment, each of even bit lines BL_E and odd bit lines BL_O may be connected to one page buffer. For example, the zeroth even bit line E0 connected to the first line H1 may be connected to one page buffer, and the zeroth odd bit line O0 connected to the third line H3 may be connected to one page buffer.

In the present disclosure, it is assumed that each of the even bit line BL_E and the odd bit line BL_O is connected to one page buffer.

In an embodiment, the memory device (100 shown in FIG. 1) may perform an operation by distinguishing the even bit lines BL_E and the odd bit lines BL_O from each other.

That is, a plurality of page buffers included in the memory device (100 shown in FIG. 1) may be distinguished according to bit lines connected thereto. According to whether memory cells on which an operation is performed has been connected to the even bit lines BL_E or the odd bit lines BL_O, the operation may be performed through page buffers connected to the corresponding bit lines.

For example, the memory device (100 shown in FIG. 1) may perform an operation on memory cells connected to the zeroth to third even bit lines E0 to E3. That is, the memory device (100 shown in FIG. 1) may perform the operation on the memory cells connected to the zeroth to third even bit lines E0 to E3 through page buffers respectively connected to the zeroth to third even bit lines E0 to E3.

The zeroth and first even bit lines E0 and E1 may be connected to an input/output device IO_01 through page buffers, and the second and third even bit lines E2 and E3 may be connected to an input/output device IO_23. The input/output device IO_01 and the input/output device IO_23 may be included in the input/output circuit (125 shown in FIG. 2).

However, when the memory device (100 shown in FIG. 1) selects page buffers by distinguishing the even bit lines BL_E and the odd bit lines BL_O from each other in a program operation, a difference in threshold voltage distribution of memory cells between plug holes may occur. That is, when a page buffer is selected with respect to a bit line, and a signal applied to the page buffer is determined, degradation of threshold voltage distribution characteristics may be caused due to a difference in program speed according to a structural difference between plug holes, i.e., a difference in width of memory cells between plug holes.

Accordingly, in the present disclosure, a page buffer is selected for each plug hole instead of with respect to a bit line, and a signal applied to the page buffer for each plug hole is determined, so that a method for mitigating or preventing degradation of threshold voltage distribution characteristics is proposed.

Figure 10:
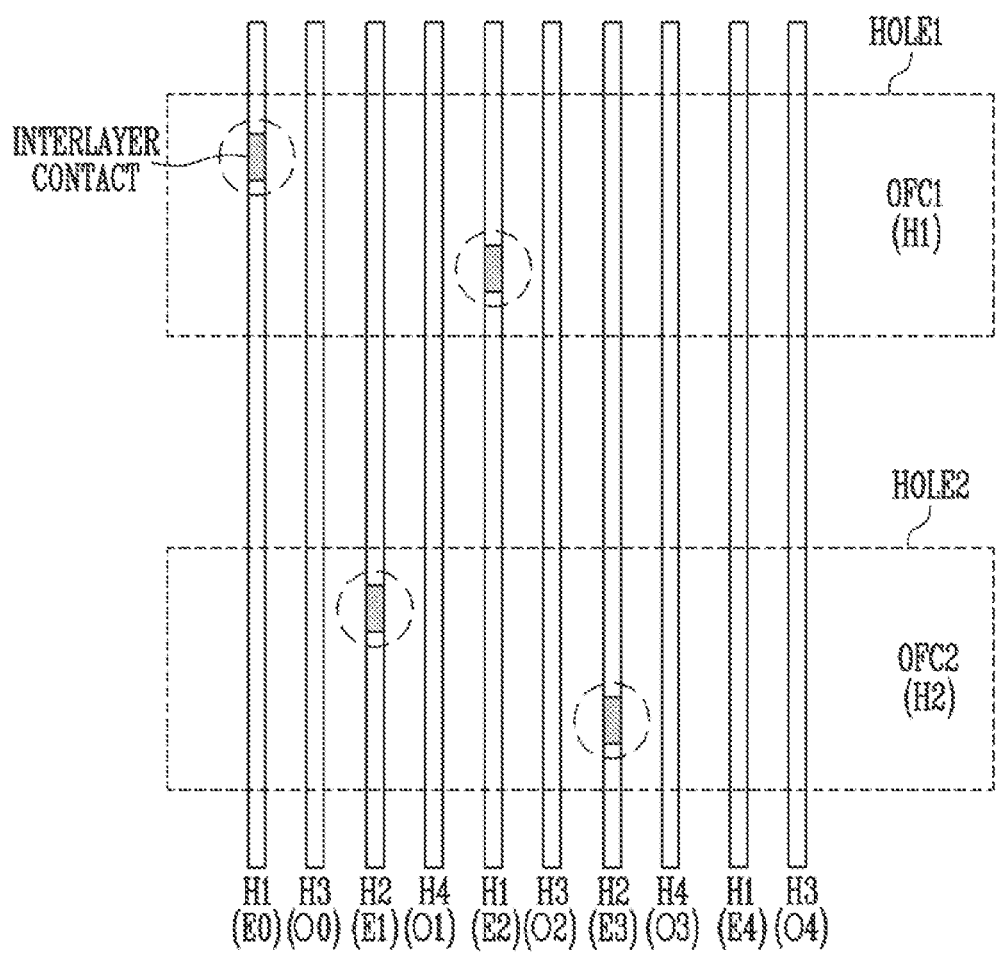
FIG. 10 is a diagram illustrating a method for performing an operation for each plug hole.

FIG. 10 is a diagram illustrating a method for performing an operation for each plug hole.

Referring to FIGS. 8 and 10, FIG. 10 illustrates a method for performing an operation on memory cells of the first plug hole HOLE1 and the second plug hole HOLE2 in the multi-stack structure shown in FIG. 8.

In FIG. 10, OFC1 and OFC2 are regions which can be in contact with interlayer contacts INTERLAYER CONTACT, and respectively present a region of the first line H1 and a region of the second line H2, which are connected to the first plug hole HOLE1 and the second plug hole HOLE2 through interlayer contacts INTERLAYER CONTACT.

In an embodiment, the memory device (100 shown in FIG. 1) may perform an operation by distinguishing plug holes from each other. For example, the memory device (100 shown in FIG. 1) may perform an operation on the first plug hole HOLE1 and the second plug hole HOLE2, which are adjacent to the slit SLIT2 shown in FIG. 8, among the first to fourth plug holes HOLE1 to HOLE4, and then perform an operation on the third plug hole HOLE3 and the fourth plug hole HOLE4. Alternatively, the memory device (100 shown in FIG. 1) may perform an operation on the third plug hole HOLE3 and the fourth plug hole HOLE4, which are adjacent to the DLS select mask DSM shown in FIG. 8, among the first to fourth plug holes HOLE1 to HOLE4, and then perform an operation on the first plug hole HOLE1 and the second plug hole HOLE2.

Therefore, when the memory device (100 shown in FIG. 1) performs an operation by distinguishing plug holes from each other, the plurality of page buffers included in the memory device (100 shown in FIG. 1) may be distinguished from each other according to plug holes, and the operation may be performed through page buffers connected to bit lines respectively corresponding to lines connected through interlayer contacts INTERLAYER CONTACT.

For example, the memory device (100 shown in FIG. 1) may perform an operation on the first plug hole HOLE1 and the second plug hole HOLE2. That is, the memory device (100 shown in FIG. 1) may perform an operation through page buffers corresponding to the zeroth and second even bit lines E0 and E2 connected to the first plug hole HOLE1 through interlayer contacts INTERLAYER CONTACT and page buffers corresponding to the first and third even bit lines E1 and E3 connected to the second plug hole HOLE2 through interlayer contacts INTERLAYER CONTACT.

In an embodiment, when the memory device (100 shown in FIG. 1) performs a program operation for each plug hole, degradation of threshold voltage distribution characteristics, which occurs due to a difference in width of memory cells between plug holes, can be mitigated or prevented.

In an embodiment, when the memory device (100 shown in FIG. 1) performs a sensing operation for each plug hole, a method for controlling the magnitude of a signal applied to a page buffer corresponding to a bit line connected to a plug hole for each plug hole may be problematic.

Figure 11:
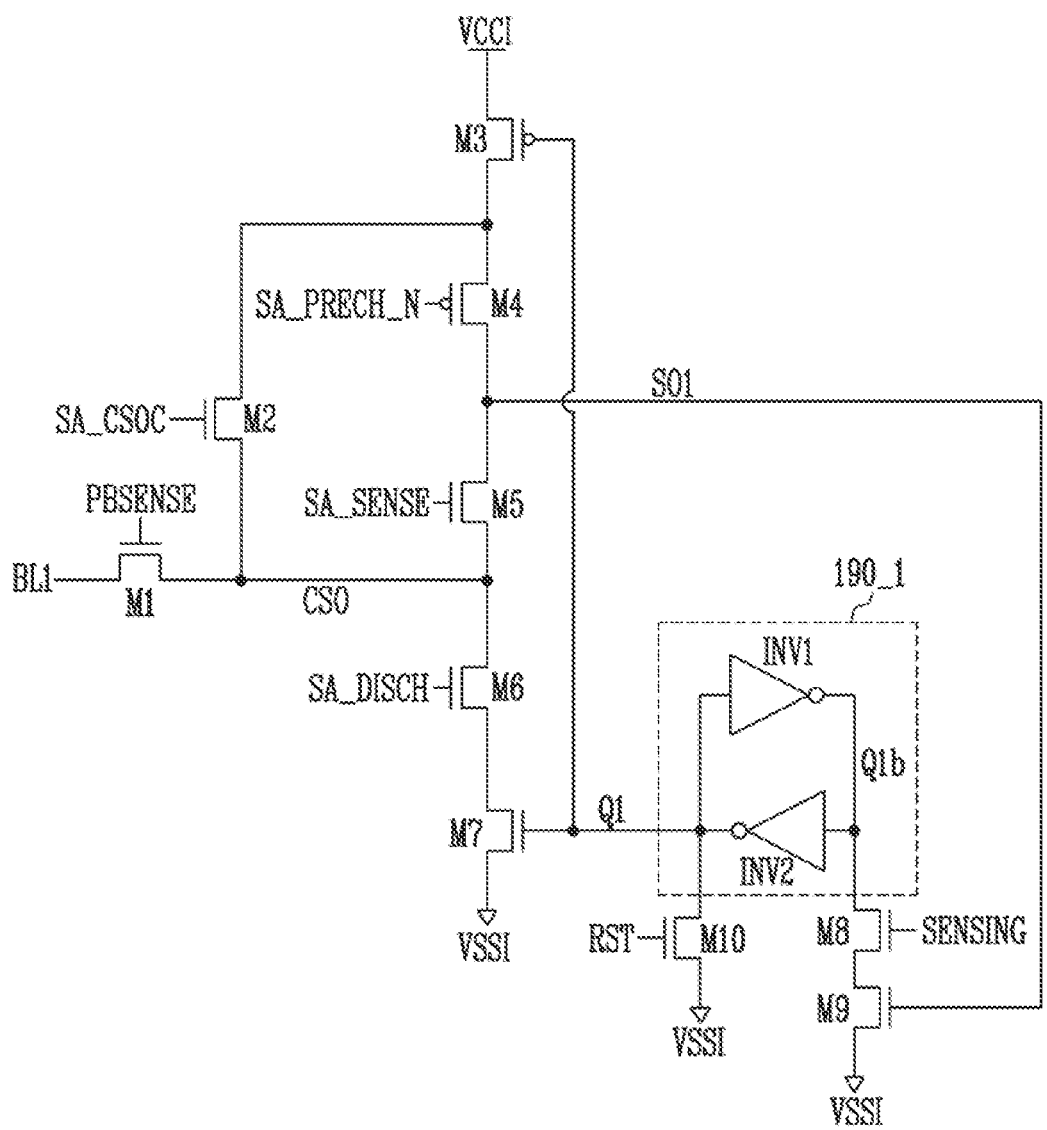
FIG. 11 is a diagram illustrating a signal controlled when an operation is performed for each plug hole.

FIG. 11 is a diagram illustrating a signal controlled when an operation is performed for each plug hole.

Referring to FIGS. 2 and 11, FIG. 11 illustrates a first page buffer PB1 among the plurality of page buffers PB1 to PBn shown in FIG. 2. Each of second to nth page buffers PB2 to PBn may also be configured with the same components as FIG. 11.

In an embodiment, the first page buffer PB1 may be connected to a first memory cell MC1 through the first bit line BL1, and may perform a bit line precharge (BL precharge) operation of charging the first bit line BL1 with charges supplied from an internal power voltage VCCI through first to fifth transistors M1 to M5. The first transistor M1 is controlled by a first sense signal PBSENSE, the second transistor M2 is controlled by a first precharge signal SA_CSOC, and the third transistor M3 is controlled by a first latch 190_1. In addition, the fourth transistor M4 is controlled by a second precharge signal SA_PRECH_N, and the fifth transistor M5 is controlled by a second sense signal SA_SENSE.

Also, the first page buffer PB1 may discharge, to an internal ground voltage VSSI, charges charged to the first bit line BL1 through the first transistor M1, a sixth transistor M6, and a seventh transistor M7. The sixth transistor M6 is controlled by a first discharge signal SA_DISCH, and the seventh transistor M7 is controlled by the first latch 190_1.

In an embodiment, the first page buffer PB1 may include the first latch 190_1 including a first inverter INV1 and a second inverter INV2. The first latch 190_1 may control the bit line precharge (BL precharge) operation by turning on or turning off the third transistor M3 through a first Q node Q1. A first Q bar node Q1b and the first Q node Q1 have values inverted relative to each other.

A voltage of a first sensing node SO1 during a sensing operation on the first memory cell MC1 is determined based on a threshold voltage of the first memory cell MC1. The first latch 190_1 may store a result obtained by sensing the threshold voltage of the first memory cell MC1 through a ninth transistor M9 connected to the first sensing node SO1. The ninth transistor M9 may be an N-type MOS transistor, and the first sensing node SO1 may be connected to a gate node of the ninth transistor M9.

Therefore, when the threshold voltage of the first memory cell MC1 is low, the first sensing node SO1 may become low during the sensing operation, and the ninth transistor M9 may be turned off. When the threshold voltage of the first memory cell MC1 is high, the sensing node SO1 may become high during the sensing operation, and the ninth transistor M9 may be turned on.

In an embodiment, the first inverter INV1 and the second inverter INV2, which are included in the first latch 190_1, are respectively connected to the internal power voltage VCCI and the internal ground voltage VSSI.

In an embodiment, the memory device (100 shown in FIG. 1) may control differently, for each plug hole, the magnitude of the first sense signal PBSENSE applied to a gate of the first transistor M1 among signals applied to the first page buffer PB1. The signals applied to the first page buffer PB1 may be generated by the voltage generator (122 shown in FIG. 2).

For example, when the memory device (100 shown in FIG. 1) performs a sensing operation for each plug hole, the magnitude of the first sense signal PBSENSE may be set differently according to positions of plug holes. That is, the magnitude of the first sense signal PBSENSE applied to a page buffer connected to a bit line corresponding to a line connected through an interlayer contact INTERLAYER CONTACT may be controlled according to positions of plug holes.

Specifically, the memory device (100 shown in FIG. 1) may control the magnitude of the first sense signal PBSENSE according to whether a plug hole is adjacent to the DSL select mask shown in FIG. 8 or whether a plug hole is adjacent to the slit SLT2 shown in FIG. 8.

Figure 12A:
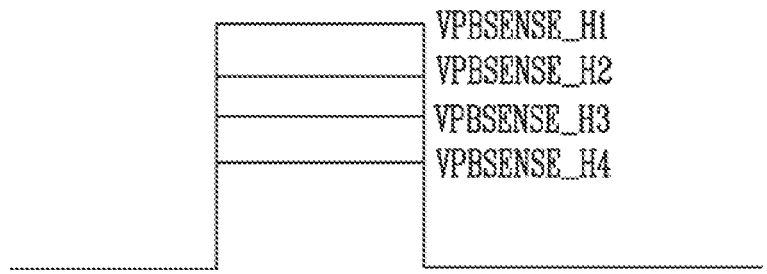
FIGS. 12A and 12B are diagrams illustrating a level of a signal applied to a page buffer for each plug hole in a sensing operation.
Figure 12B:
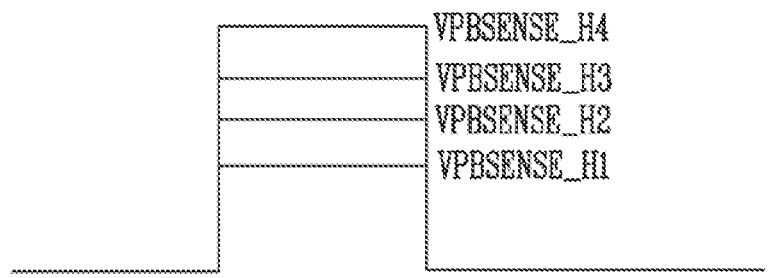

FIGS. 12A and 12B are diagrams illustrating a level of a signal applied to a page buffer for each plug hole in a sensing operation.

Referring to FIGS. 8, 11, 12A, and 12B, FIG. 12A illustrates a case where the first sense signal PBSENSE shown in FIG. 11 is increased in conjunction with coming closer to the slit SLIT2, when an operation is performed for each plug hole, and FIG. 12B illustrates a case where the first sense signal PBSENSE shown in FIG. 11 is decreased in conjunction with coming closer to the slit SLIT2, when an operation is performed for each plug hole. That is, the magnitude of the first sense signal PBSENSE may become larger or smaller according to the position of the plug hole.

In an embodiment, the memory device (100 shown in FIG. 1) may perform a sensing operation for each plug hole. The sensing operation may be a read operation or a verify operation.

When the sensing operation is performed for each plug hole, the memory device (100 shown in FIG. 1) may control, for each plug hole, the magnitude of a first sense signal PBSENSE applied to a page buffer corresponding to the plug hole. The page buffer corresponding to the plug hole may be connected to a bit line corresponding to a line connected to the corresponding plug hole through an interlayer contact INTERLAYER CONTACT.

Referring to FIG. 12A, when the sensing operation is performed for each plug hole, the memory device (100 shown in FIG. 1) may increase the magnitude of the first sense signal PBSENSE as the plug hole becomes closer to the slit SLIT2. Alternatively, the memory device (100 shown in FIG. 1) may decrease the magnitude of the first sense signal PBSENSE as the plug hole becomes closer to the DSL select mask DSM.

For example, a magnitude of VPBSENSE_H1 as a signal applied to a gate of a first transistor M1 in a page buffer corresponding to the first plug hole HOLE1 may be greater than that of VPBSENSE_H2 as a signal applied to a gate of a first transistor M1 in a page buffer corresponding to the second plug hole HOLE2. That is, because the first plug hole HOLE1 is closer to the slit SLIT2 than the second plug hole HOLE2, or because the first plug hole HOLE1 is more distant from the DSL select mask DSM than the second plug hole HOLE2, the magnitude of the VPBSENSE_H1 may be greater than that of the VPBSENSE_H2.

As described above, the magnitude of the VPBSENSE_H2 may be greater than that of VPBSENSE_H3 as a signal applied to a gate of a first transistor M1 in a page buffer corresponding to the third plug hole HOLE3. In addition, the magnitude of the VPBSENSE_H3 may be greater than that of VPBSENSE_H4 as a signal applied to a gate of a first transistor M1 in a page buffer corresponding to the fourth plug hole HOLE4.

Referring to FIG. 12B, when the sensing operation is performed for each plug hole, the memory device (100 shown in FIG. 1) may decrease the magnitude of the first sense signal PBSENSE as the plug hole becomes closer to the slit SLIT2. Alternatively, the memory device (100 shown in FIG. 1) may increase the magnitude of the first sense signal PBSENSE as the plug hole becomes closer to the DSL select mask DSM.

For example, the magnitude of the VPBSENSE_H1 as a signal applied to the gate of the first transistor M1 in the page buffer corresponding to the first plug hole HOLE1 may be smaller than that of the VPBSENSE_H2 as a signal applied to the gate of the first transistor M1 in the page buffer corresponding to the second plug hole HOLE2. That is, because the first plug hole HOLE1 is closer to the slit SLIT2 than the second plug hole HOLE2, or because the first plug hole HOLE1 is more distant from the DSL select mask DSM than the second plug hole HOLE2, the magnitude of the VPBSENSE_H1 may be smaller than that of the VPBSENSE_H2.

As described above, the magnitude of the VPBSENSE_H2 may be smaller than that of the VPBSENSE_H3 as a signal applied to the gate of the first transistor M1 in the page buffer corresponding to the third plug hole HOLE3. In addition, the magnitude of the VPBSENSE_H3 may be smaller than that of the VPBSENSE_H4 as a signal applied to the gate of the first transistor M1 in the page buffer corresponding to the fourth plug hole HOLE4.

Figure 13:
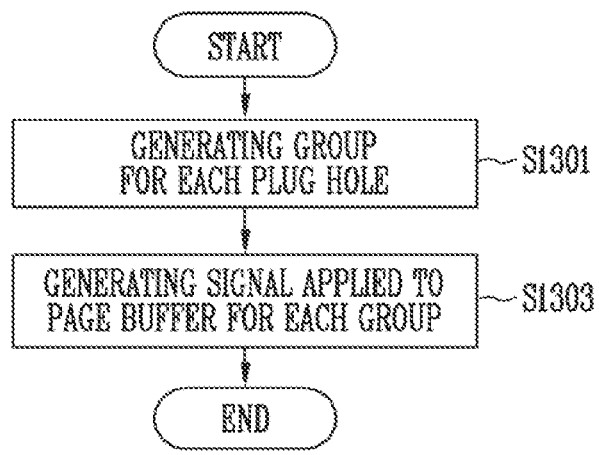
FIG. 13 is a flow diagram illustrating an operation of the memory device in accordance with an embodiment of the present disclosure.

FIG. 13 is a flow diagram illustrating an operation of the memory device in accordance with an embodiment of the present disclosure.

Referring to FIG. 13, in step S1301, the memory device may generate a group for each plug hole in a sensing operation. The plug hole may be formed in a vertical hole vertically penetrating word lines and interlayer insulating layers when memory cells are formed in a stack structure in a three-dimensional array structure.

When the group is generated for each plug hole, in step S1303, the memory device may generate a signal applied to a page buffer for each plug hole group.

For example, the sensing operation on some plug holes among a plurality of plug holes may be preferentially performed. The memory device may control the signal applied to the page buffer according to whether a plug hole is close to or distant from the slit SLIT2 or the DSL select mask DSM.

In an embodiment, the magnitude of the signal applied to the page buffer may be increased as the plug hole becomes closer to the slit. Alternatively, the magnitude of the signal applied to the page buffer may be decreased as the plug hole becomes closer to the slit.

Figure 14:
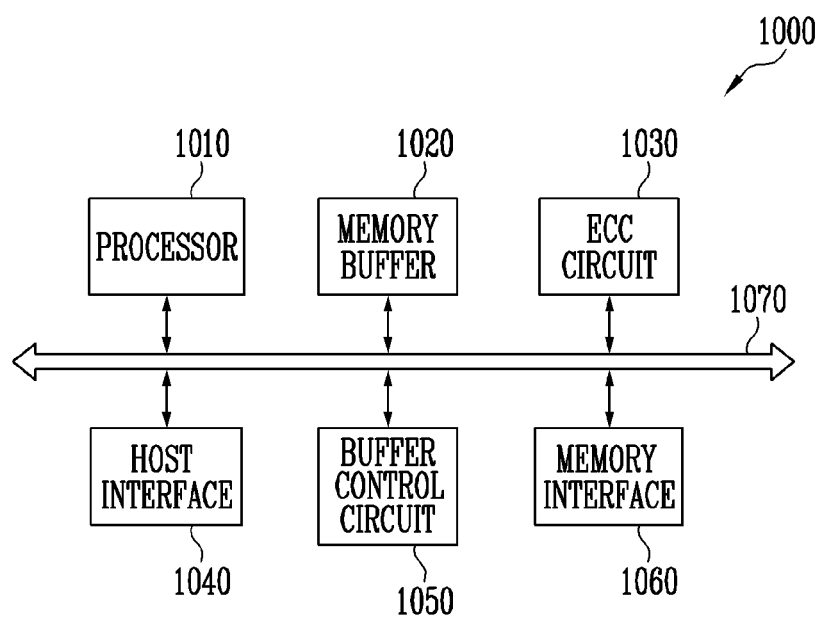
FIG. 14 is a diagram illustrating another embodiment of a memory controller shown in FIG. 1.

FIG. 14 is a diagram illustrating another embodiment of a memory controller shown in FIG. 1.

Referring to FIG. 14, a memory controller 1000 is connected to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform logical operations. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as working memory, cache memory, or buffer memory.

The processor 1010 may perform a function of a flash translation layer (FTL). The processor 1010 may translate a logical block address LBA provided by the host through the FTL into a physical block address PBA. The FTL may receive a logic block address LPA, using a mapping table, to be translated into a physical block address PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

The processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may store data processed by the processor 1010. The memory buffer 1020 may include Static RAM (SRAM) or Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an embodiment, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 as configured to communicate with the memory device under the control of the processor 1010. The memory interface 1060 may communicate a command, an address, and data with the memory device through a channel.

In an embodiment, the memory controller 1000 may not include the memory buffer 1020 and the buffer control circuit 1050.

In an embodiment, the processor 1010 may control an operation of the memory controller 1000 by using codes. The processor 1010 may load codes from a nonvolatile memory device (e.g., a device including read only memory (ROM)) provided in the memory controller 1000. In another example, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and do not interfere or influence with each other. The data bus may be connected to the host interface 1040, the buffer control circuit 1050, the ECC circuit 1030, and the memory interface 1060. The control bus may be connected to the host interface 1040, the processor 1010, the buffer control circuit 1050, the memory buffer 1020, and the memory interface 1060.

Figure 15:
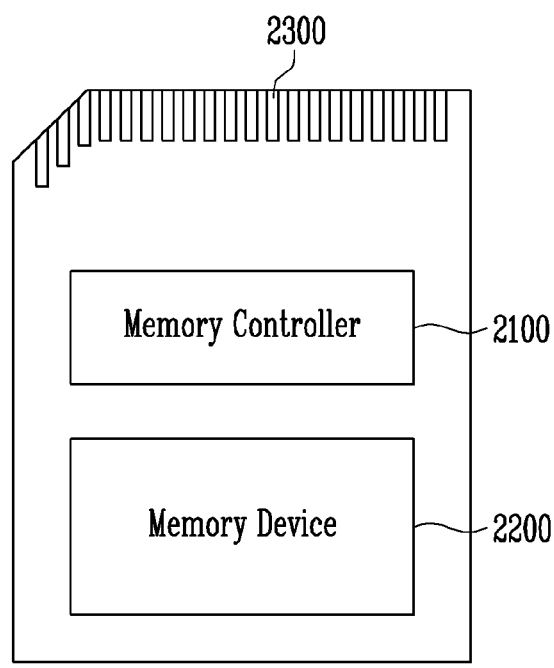
FIG. 15 is a block diagram illustrating a memory card system to which the storage device is applied in accordance with an embodiment of the present disclosure.

FIG. 15 is a block diagram illustrating a memory card system 2000 to which the storage device is applied in accordance with an embodiment of the present disclosure.

Referring to FIG. 15, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory device 2200 may be implemented identically to the memory device 100 (100 shown in FIG. 1).

In an embodiment, the memory controller 2100 may include components such as Random Access Memory (RAM), a processing unit, a host interface, a memory interface, and an error corrector.

The memory controller 2100 may communicate with an external device through the connector 2300. The memory controller 2100 may communicate with the external device (e.g., the host) according to a specific communication protocol. In an embodiment, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an embodiment, the memory device 2200 may be implemented using nonvolatile memory, such as Electrically Erasable and Programmable ROM (EEPROM), NAND flash memory, NOR flash memory, Phase-change RAM (PRAM), Resistive RAM (ReRAM), Ferroelectric RAM (FRAM), and Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC an SD card (SD, miniSD, microSD and SDHC), and a Universal Hash Storage (UFS).

In an embodiment, memory cells included in the memory device 2200 may form a three-dimensional array structure. In the three-dimensional array structure, the memory cells may form a stack structure, and a plug hole may be formed in a vertical hole vertically penetrating word lines and interlayer insulating layers. The stack structure may be formed between a slit SLIT2 and a DSL select mask DSM.

In an embodiment, when the memory device 2200 performs a sensing operation, the sensing operation may be performed for each plug hole. For example, the memory device 2200 may preferentially perform the sensing operation on memory cells of a plug hole adjacent to the slit SLIT2. Alternatively, the memory device 2200 may preferentially perform the sensing operation on memory cells of a plug hole adjacent to the DSL select mask DSM.

The memory device 2200 may set the magnitude of a signal applied to a gate of a transistor connecting a bit line and a page buffer to be increased as the plug hole becomes closer to the slit SLIT2. Alternatively, the memory device 2200 may set the magnitude of a signal applied to a gate of a transistor connecting a bit line and a page buffer to be decreased as the plug hole becomes more distant from the slit SLIT2.

The memory device 2200 performs a program operation for each plug hole, so that degradation of threshold voltage distribution characteristics, which occurs due to a difference in width of memory cells between plug holes, can be mitigated or prevented.

Figure 16:
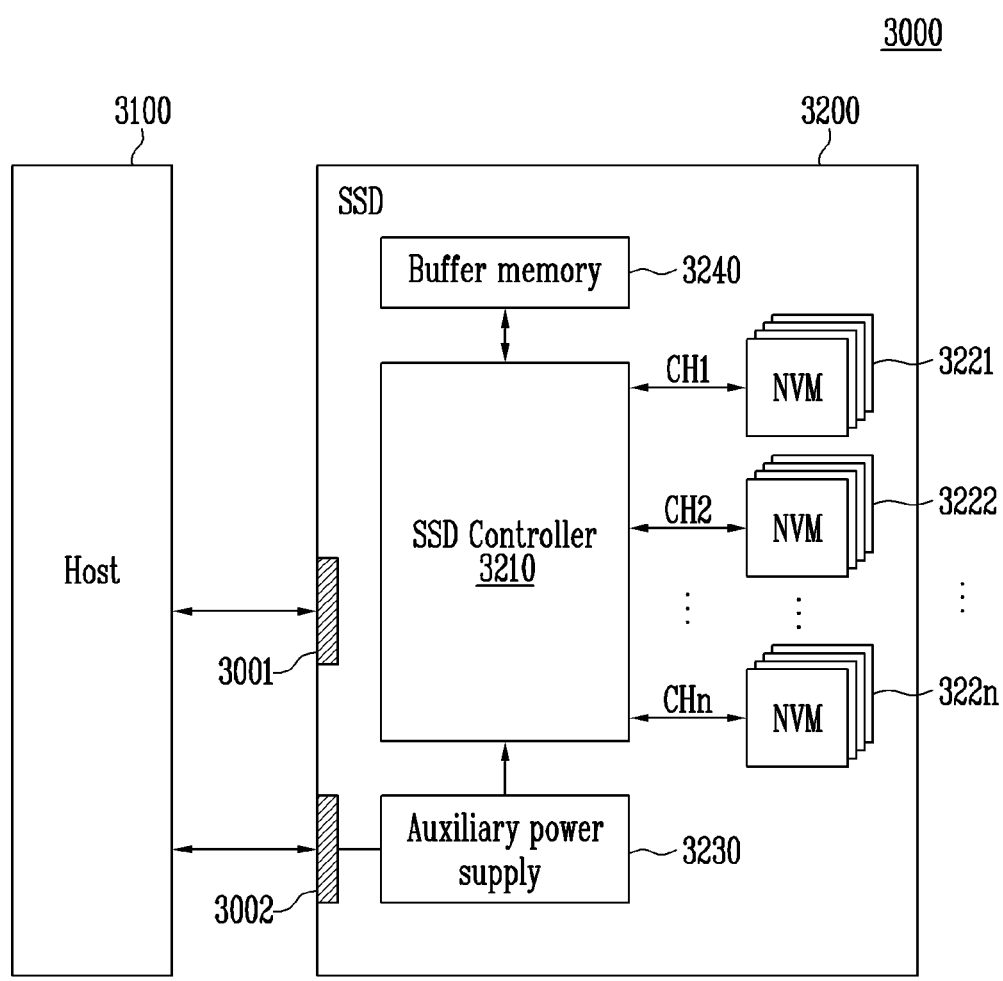
FIG. 16 is a block diagram illustrating a Solid State Drive (SSD) system to which the storage device is applied in accordance with an embodiment of the present disclosure.

FIG. 16 is a block diagram illustrating a Solid State Drive (SSD) system 3000 to which the storage device is applied in accordance with an embodiment of the present disclosure.

Referring to FIG. 16, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller (200 shown in FIG. 1).

The SSD controller 3210 may control the plurality of flash memories 3221 to 322n in response to a signal SIG received from the host 3100. In an embodiment, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), a firewire, a Universal Hash Storage (UFS), a WI-FI, a Bluetooth, and an NVMe.

The auxiliary power supply 3230 is connected to the host 3100 through the power connector 3002. When the supply of power from the host 3100 is not smooth, the auxiliary power supply 3230 may provide power of the SSD 3200. In different embodiments, the auxiliary power supply 3230 may be located in the SSD 3200, or be located outside of the SSD 3200. For example, the auxiliary power supply 3230 may be located on a main board, and provide auxiliary power to the SSD 3200.

The buffer memory 3240 operates as buffer memory of the SSD 3200. The auxiliary power supply 3230 may receive power PWR input from the host 3100 and charge with the power PWR. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memory such as DRAM, SDRAM, DDR SDRAM, LPDDR SDRAM, or GRAM or nonvolatile memory such as FRAM, ReRAM, STT-MRAM, or PRAM.

In an embodiment, memory cells included in each of the plurality of flash memories 3221 to 322n may form a three-dimensional array structure. In the three-dimensional array structure, the memory cells may form a stack structure, and a plug hole may be formed in a vertical hole vertically penetrating word lines and interlayer insulating layers. The stack structure may be formed between a slit SLIT2 and a DSL select mask DSM.

In an embodiment, when the plurality of flash memories 3221 to 322n perform a sensing operation, the sensing operation may be performed for each plug hole. For example, the plurality of flash memories 3221 to 322n may preferentially perform the sensing operation on memory cells of a plug hole adjacent to the slit SLIT2. Alternatively, the plurality of flash memories 3221 to 322n may preferentially perform the sensing operation on memory cells of a plug hole adjacent to the DSL select mask DSM.

The plurality of flash memories 3221 to 322n may set the magnitude of a signal applied to a gate of a transistor connecting a bit line and a page buffer to be increased as the plug hole becomes closer to the slit SLIT2. Alternatively, the plurality of flash memories 3221 to 322n may set the magnitude of a signal applied to a gate of a transistor connecting a bit line and a page buffer to be decreased as the plug hole becomes more distant from the slit SLIT2.

The plurality of flash memories 3221 to 322n perform a program operation for each plug hole, so that degradation of threshold voltage distribution characteristics, which occurs due to a difference in width of memory cells between plug holes, can be mitigated or prevented.

Figure 17:
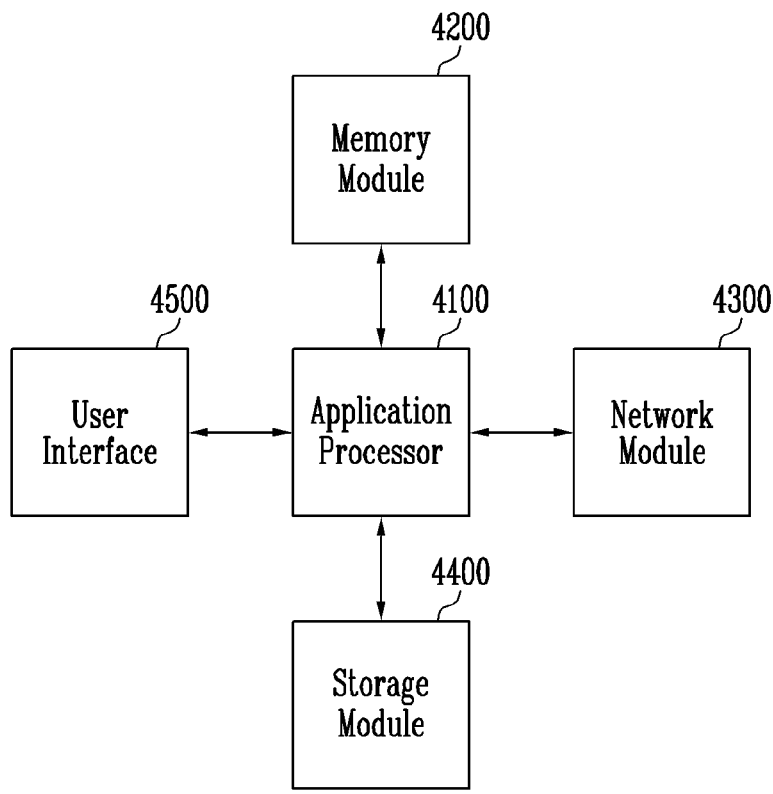
FIG. 17 is a block diagram illustrating a user system to which the storage device is applied in accordance with an embodiment of the present disclosure.

FIG. 17 is a block diagram illustrating a user system 4000 to which the storage device is applied in accordance with an embodiment of the present disclosure.

Referring to FIG. 17, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an embodiment, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory, or cache memory of the user system 4000. The memory module 4200 may include volatile random access memory such as DRAM, SDRAM, DDR SDRAM, DDR2 SDRAM, DDR3 SDRAM, LPDDR SDRAM, LPDDR2 SDRAM, or LPDDR3 SDRAM or nonvolatile random access memory such as PRAM, ReRAM, MRAM, or FRAM. In an embodiment, the application processor 4100 and the memory module 4200 may be consolidated as one semiconductor package by being packaged based on a Package on Package (PoP).

The network module 4300 may communicate with external devices. In an embodiment, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Exemplarily, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an embodiment, the storage module 4400 may be implemented with nonvolatile semiconductor memory such as Phase-change RAM (PRAM), Magnetic RAM (MRAM), Resistive RAM (RRAM), NAND flash, NOR flash, or NAND flash having a three-dimensional structure. In an embodiment, the storage module 4400 may be a removable drive such as a memory card of the user system 4000 or an external drive.

In an embodiment, the storage module 4400 may include a plurality of nonvolatile memory devices, and the plurality of nonvolatile memory devices may operate identically to the memory device described with reference to FIGS. 2 to 5. The storage module 4400 may operate identically to the storage device 50 described with reference to FIG. 1.

The user interface 4500 may include interfaces for inputting data or commands to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In an embodiment, memory cells included in the storage module 4400 may form a three-dimensional array structure. In the three-dimensional array structure, the memory cells may form a stack structure, and a plug hole may be formed in a vertical hole vertically penetrating word lines and interlayer insulating layers. The stack structure may be formed between a slit SLIT2 and a DSL select mask DSM.

In an embodiment, when the storage module 4400 performs a sensing operation, the sensing operation may be performed for each plug hole. For example, the storage module 4400 may preferentially perform the sensing operation on memory cells of a plug hole adjacent to the slit SLIT2. Alternatively, the storage module 4400 may preferentially perform the sensing operation on memory cells of a plug hole adjacent to the DSL select mask DSM.

The storage module 4400 may set the magnitude of a signal applied to a gate of a transistor connecting a bit line and a page buffer to be increased as the plug hole becomes closer to the slit SLIT2. Alternatively, the storage module 4400 may set the magnitude of a signal applied to a gate of a transistor connecting a bit line and a page buffer to be decreased as the plug hole becomes more distant from the slit SLIT2.

The storage module 4400 performs a program operation for each plug hole, so that degradation of threshold voltage distribution characteristics, which occurs due to a difference in width of memory cells between plug holes, can be mitigated or prevented.

In accordance with an embodiment of the present disclosure, the magnitude of a signal applied to a page buffer for each plug hole is set differently, so that degradation of a threshold voltage distribution can be prevented.

While the present disclosure has been shown and described with reference to certain embodiments, it will be understood by those skilled in the art that various changes in form and detail may be made without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device including a memory block to which a plurality of lines are connected, the memory device comprising:
    a plurality of memory cells respectively connected to word lines among the plurality of lines, wherein the plurality of memory cells are formed as a plurality of plug holes formed in a stack structure between a drain select line among the plurality of lines and a slit;
    a plurality of page buffers connected to the plurality of memory cells through a plurality of bit lines among the plurality of lines; and
    a peripheral circuit configured to perform a read operation on memory cells of a first plug hole among the plurality of plug holes,
    wherein the first plug hole includes at least two memory cells among the plurality of memory cells, and is connected to at least two bit lines among the plurality of bit lines,
    wherein the peripheral circuit includes a voltage generator which is, during the read operation, configured to adjust a magnitude of a signal applied to at least two page buffers corresponding to the at least two bit lines among the plurality of page buffers to precharge the at least two bit lines according to a position of the first plug hole.

2. The memory device of claim 1,
    wherein the voltage generator is capable of controlling the magnitude of a signal applied to a first transistor connected to each of the at least two bit lines among transistors included in each of the at least two page buffers according to the position of the first plug hole.

3. The memory device of claim 2,
    wherein the peripheral circuit is configured to perform the read operation on the first plug hole adjacent to the drain select line among the plurality of plug holes.

4. The memory device of claim 3,
    wherein the voltage generator is capable of increasing the magnitude of a signal applied to the first transistor as the first plug hole is more adjacent to the drain select line.

5. The memory device of claim 3,
    wherein the voltage generator is capable of decreasing the magnitude of a signal applied to the first transistor as the first plug hole is more adjacent to the drain select line.

6. The memory device of claim 3,
    wherein the peripheral circuit is configured to perform the read operation on the first plug hole adjacent to the drain select line, and then perform the read operation on a second plug hole adjacent to the slit.

7. The memory device of claim 2,
    wherein the peripheral circuit is configured to perform the read operation on the first plug hole adjacent to the slit among the plurality of plug holes.

8. The memory device of claim 7,
    wherein the voltage generator is capable of increasing the magnitude of a signal applied to the first transistor as the first plug hole is more adjacent to the drain select line.

9. The memory device of claim 7,
    wherein the voltage generator is capable of decreasing the magnitude of a signal applied to the first transistor as the first plug hole is more adjacent to the drain select line.

10. The memory device of claim 7,
    wherein the peripheral circuit is configured to perform the read operation on the first plug hole adjacent to the slit and then perform the read operation on a second plug hole adjacent to the drain select line.

11. A method for operating a memory device including a memory block to which a plurality of lines are connected, wherein the memory block includes a plurality of memory cells respectively connected to word lines among the plurality of lines and a plurality of page buffers connected to the plurality of memory cells through a plurality of bit lines among the plurality of lines, and wherein the plurality of memory cells are formed as a plurality of plug holes formed in a stack structure between a drain select line among the plurality of lines and a slit, the method comprising:

generating a plurality of plug hole groups according to positions of the plurality of plug holes;

determining a first plug hole group including at least two memory cells among the plurality of memory cells, and connected to at least two bit lines among the plurality of bit lines; and adjusting, in the read operation on the first plug hole group, a magnitude of a signal applied to at least two page buffers corresponding to the at least two bit lines among a plurality of page buffers to precharge the at least two bit lines according to a position of the first plug hole group.

12. The method of claim 11,
wherein adjusting the magnitude of the signal comprises controlling the magnitude of a signal applied to a first transistor connected to each of the at least two bit lines among transistors included in each of the at least two page buffers.

13. The method of claim 12,
wherein the read operation is performed on the first plug hole group adjacent to the drain select line among the plurality of plug hole groups.

14. The method of claim 13,
wherein adjusting the magnitude of the signal comprises increasing the magnitude of a signal applied to the first transistor as the first plug hole group is more adjacent to the drain select line.

15. The method of claim 13,
wherein adjusting the magnitude of the signal comprises decreasing the magnitude of a signal applied to the first transistor as the first plug hole group is more adjacent to the drain select line.

16. The method of claim 13,
wherein after the read operation is performed on the first plug hole group adjacent to the drain select line, the read operation is performed on second plug hole group adjacent to the slit.

17. The method of claim 12,
wherein the read operation is performed on the first plug hole group adjacent to the slit among the plurality of plug holes.

18. The method of claim 17,
wherein adjusting the magnitude of the signal comprises increasing the magnitude of a signal applied to the first transistor as the first plug hole group is more adjacent to the drain select line.

19. The method of claim 17,
wherein adjusting the magnitude of the signal comprises decreasing the magnitude of a signal applied to the first transistor as the first plug hole group is more adjacent to the drain select line.

20. The method of claim 17,
wherein, after the read operation is performed on the first plug hole group adjacent to the slit, the read operation is performed on a second plug hole group adjacent to the drain select line.

* * * * *